(12) United States Patent
Watanabe et al.

(10) Patent No.: US 6,575,552 B2
(45) Date of Patent: Jun. 10, 2003

(54) PRINTER HEAD

(75) Inventors: Seiichi Watanabe, Tokyo (JP); Kenji Shinozaki, Kanagawa (JP); Minoru Kohno, Tokyo (JP); Hiroyuki Mitsuhashi, Kanagawa (JP); Minehiro Tonosaki, Kanagawa (JP); Masato Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/197,130

(22) Filed: Jul. 17, 2002

(65) Prior Publication Data

US 2002/0182340 A1 Dec. 5, 2002

Related U.S. Application Data

(62) Division of application No. 09/598,308, filed on Jun. 21, 2000, now Pat. No. 6,447,849.

(30) Foreign Application Priority Data

Jun. 23, 1999 (JP) .......................................... P11-177193

(51) Int. Cl.[7] .................................................. C23C 14/00
(52) U.S. Cl. ........................ 347/20; 427/123; 427/124; 427/331; 427/404; 427/523; 427/537; 427/576
(58) Field of Search ............................ 347/20; 427/523, 427/123, 124, 331, 404, 537, 576

Primary Examiner—Bernard Pianalto
(74) Attorney, Agent, or Firm—Sonnenschein, Nath & Rosenthal (57) ABSTRACT

A surface processing method for processing the surface of an insulating article in which an ion-implanted surface-modified layer is effectively formed on the article 2. In surface processing the article 2 of an insulating material, an electrically conductive thin metal film 50 is first formed on the article surface. A pulsed voltage containing a positive pulsed voltage and a negative pulsed voltage is applied to the article in a plasma containing ions to be implanted to implant ions in the article surface. This implants ions at right angles to the article surface to generate a surface-modified layer 51. There is no possibility of the article 2 being charged up due to application of a pulsed voltage.

2 Claims, 4 Drawing Sheets

PRINTER HEAD

RELATED APPLICATION DATA

This application claims priority to Japanese Patent Application No. P11-177193, filed Jun. 23, 1999, and is a divisional of U.S. patent application Ser. No. 09/598,308, U.S. Pat. No. 6,447,849, filed Jun. 21, 2000.

BACKGROUND OF THE INVENTION

1. Field of the Invention

This invention relates to a surface processing method for processing the surface of an insulating article by ion injection and to a printer head provided in a printer configured for ejecting ink droplets to an article for printing to effect printing. This invention also relates to a substrate for a recording medium for supporting a signal recording layer of a recording medium.

2. Description of Related Art

For improving a variety of physical and chemical characteristics of an article being processed, such as hardness, elasto-plasticity, electrical conductivity, lubricating properties, durability, moisture-proofness, corrosion proofness, wettability or gas transmittance, there has been known a technique of implanting ions into the surface.

For implanting ions into the surface of an article being processed, there is a so-called ion beam implanting method of directly illuminating an ion beam on the article. However, the ion beam implanting method suffers from the problem that, if an article being processed has a three-dimensional structure, it is difficult to implant ions uniformly on the article surface.

For enabling uniform ion implantation on the article surface even if the article has a three-dimensional structure, there is proposed a technique of generating a plasma containing the ions to be implanted to implant the ions contained in the plasma into the article being processed. This technique is referred to below as a plasma implantation method.

Figure 1:
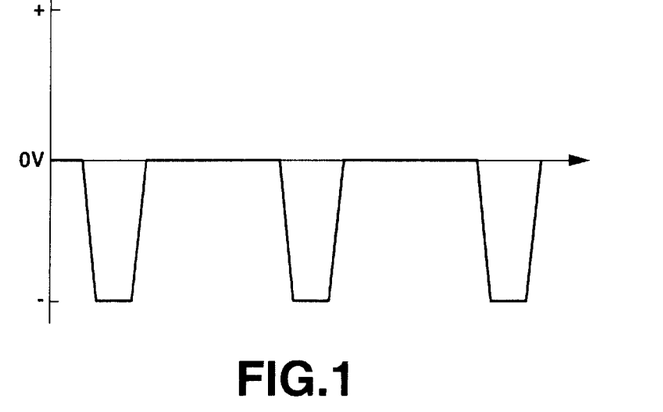
FIG. 1 shows a waveform of a pulsed voltage to be applied to an article being processed in a conventional surface processing method.

In implanting ions by the plasma implantation method into the article, the article is placed in a plasma containing the ions to be implanted and a negative pulse voltage such as is shown in FIG. 1 is applied to the article. On applying the negative voltage to the article, the ions contained in the plasma are pulled into the article so that the ions are implanted on the article surface.

In the plasma implanting method, if the plasma containing the ions to be implanted is generated uniformly around the article being processed, the ions can be uniformly implanted on the article surface even if the article has a three-dimensional structure.

However, the above-described plasma implantation method is used exclusively for a case wherein the article to be processed is formed of an electrically conductive material, such as metal. The reason is that, if the article being processed is an insulating material, and ion implantation is executed by the plasma implantation method, electrical charges are accumulated in the article being processed, thus setting up what is called a charge-up state. If charge-up of the article being processed occurs in the plasma implantation method, the ions contained in the plasma cease to be pulled effectively into the article being processed. The result is that, if the plasma implantation method is applied to the insulating material, the process time is prolonged to render it difficult to improve the productivity.

SUMMARY OF THE INVENTION

It is therefore an object of the present invention to provide a surface processing method for an insulating material in which surface processing by ion implantation by the plasma implantation method can be realized effectively despite the fact that the article being processed is an insulating material. It is another object of the present invention to provide a printer head and a substrate for a recording medium each having on its surface a surface modified layer achieved as a result of ion implantation.

In one aspect, the present invention provides a surface processing method for an insulating material, in which ions are implanted in the insulating material to process its surface, including the steps of forming an electrically conductive thin metal film on the surface of the insulating material and applying a pulsed voltage containing a positive pulsed voltage and a negative pulsed voltage to the insulating material in a plasma containing ions to be implanted to implant ions in the surface of the insulating material.

In the surface processing method for an insulating material, according to the present invention, in which the bias voltage applied to the insulating material is a pulsed voltage containing a positive pulsed voltage and a negative pulsed voltage, there is no possibility of electrical charges being accumulated in the insulating material during the ion implantation. Since the electrically conductive thin metal film is formed on the surface of the insulating material, there is produced an electrical field in a direction perpendicular to the surface of the insulating material on application of the pulsed voltage. This implants ions in a direction perpendicular to the surface of the insulating material to realize effective ion implantation.

In another aspect, the present invention provides a printer head provided on a printer adapted to perform printing by ejecting ink liquid droplets towards a printing support, wherein a surface-modified layer modified in surface properties by ion implantation is formed on the surface of a liquid droplet ejecting portion adapted to eject the ink liquid droplets.

In the printer head of the present invention, in which the surface-modified layer is formed in its liquid droplet ejecting portion, it is possible to control the wettability to the ink of the liquid droplet ejecting portion and hence to prevent ink scorching or mixing of different sorts of inks in this liquid droplet ejecting portion.

In yet another aspect, the present invention provides a substrate for a recording medium adapted to support a signal recording layer of the recording medium, wherein a surface-modified layer modified in surface properties by ion implantation is formed on the surface of the substrate for the recording medium.

The substrate for the recording medium according to the present invention is improved in hardness or tenacity by provision of the surface-modified layer on its surface.

In the surface processing method for the insulating material according to the present invention, there is no risk of electrical charges from being accumulated in the insulating material despite the fact that ion implantation is executed on the insulating material. Since the electrically conductive thin metal film is formed on the surface of the insulating material prior to ion implantation, the ions are implanted in a direction perpendicular to the surface of the insulating material, so that ions may be implanted effectively even if the insulating material has a three-dimensional surface profile. The result is that ion implantation can occur on end effectively even if ions are implanted in the insulating material. This assures high-quality surface processing for an insulating material.

In the printer head according to the present invention, in which a surface-modified layer is provided in the liquid droplet ejecting portion, it is possible to control the ink wettability in this liquid droplet ejecting portion. This prevents ink scorching or mixing of different sorts of inks in the liquid droplet ejecting portion to improve the printing quality and operational reliability.

In the substrate for a recording medium, according to the present invention, in which a surface-modified layer is provided on its surface, it is possible to improve hardness and tenacity. Thus, by employing the substrate for a recording medium according to the present invention, a recording medium of high reliability may be provided which is reduced in flexure or deviation from surface planarity to cope with the tendency towards high recording density.

DESCRIPTION OF THE PREFERRED EMBODIMENTS

Figure 2:
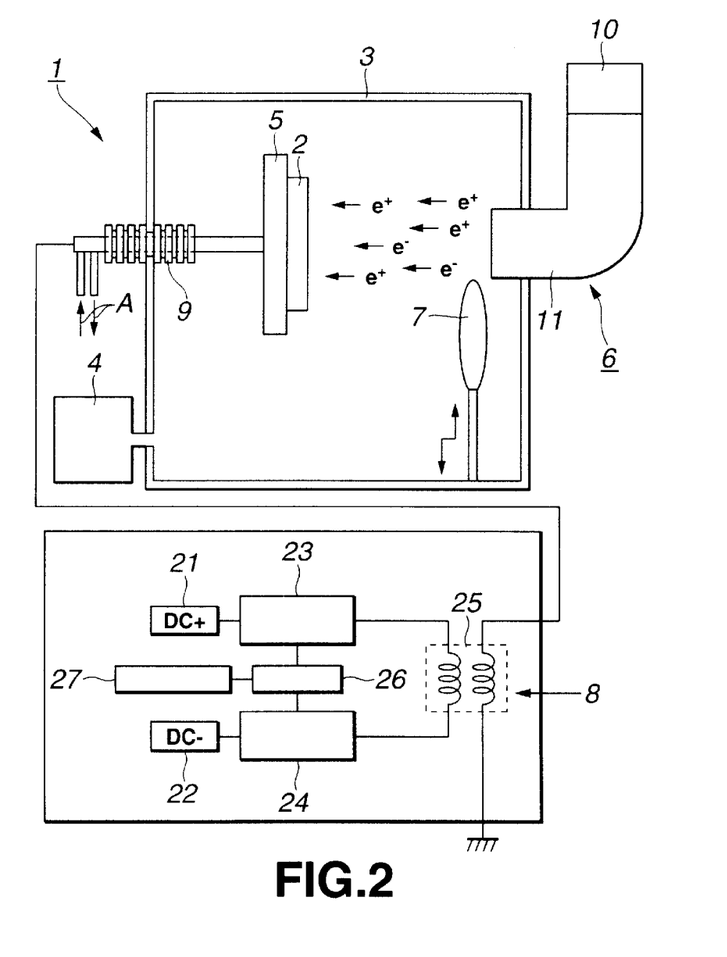
FIG. 2 is a schematic view showing an illustrative structure of surface processing device used for carrying out the surface processing method for an insulating material according to the present invention.

Referring to the drawings, preferred embodiments of according to the present invention will be explained in detail. As an illustrative structure of the surface processing device, used for surface processing an insulating material according to the present invention, a surface processing device 1, shown in FIG. 2, is explained. This surface processing device 1 processes the surface of a article 2 formed of an insulating material by implanting ions therein by the plasma implantation method.

The material of the article 2, to be surface-processed by the ion implantation, may be enumerated by, for example, plastic materials, such as amorphous polyolefin (APO), polycarbonate (PC), polymethyl methacrylate (PMMA), polyethylene terephthalate (PET), acrylic resin, polyimide resin, carbon materials and glass materials. The ion species implanted into the article may be enumerated by, for example, C, N, W, Ta, Cr, Mo, Co, Pt, Ni, Fe, Ti, Mn, Cu and Storage means.

This surface processing device 1 includes a vacuum vessel 3, a cryo pump 4 for evacuating the inside of the vacuum vessel 3, a holder 5 for supporting the article 2 in the vacuum vessel 3, an ion generator 6 for supplying ions to be implanted to the article 2, a shutter 7 for turning ion supply on or off, and a pulse voltage source 8 for applying a pulsed voltage, including a positive pulse voltage and a negative pulse voltage, to the article 2.

The vacuum vessel 3 is a vessel the inside of which is evacuated to establish a high vacuum state. This surface processing device 1 generates a plasma containing ions to be implanted into the article 2 to effect ion implantation into the article 2.

The cryo pump 4 is a vacuum pump for evacuating the inside of the vacuum vessel 3 to establish a high vacuum state. For surface processing the article 2, the inside of the vacuum vessel 3 is evacuated by the cryo pump 4 to set the pressure prior to introducing ions into the inside of the vacuum vessel 3, that is the background pressure, to, for example, $10^{-7}$ Torr or less. On the other hand, the pressure when the ions have been introduced into the inside of the vacuum vessel 3 to generate the plasma, that is the pressure during surface processing, is set to, for example, approximately $10^{-4}$ Torr or less.

The holder 5 is used for supporting the article 2 and is supported within the inside of the vacuum vessel 3 by an insulating supporting member 9 mounted in the vacuum vessel 3. For surface processing the article 2, the article 2 is secured to the holder 5.

In the holder 5 is mounted a cooling water inlet pipe through which the cooling water is circulated to cool the article 2 secured to the holder 5. This cooling water inlet pipe is led to outside of the vacuum vessel 3 through the supporting member 9, and is fed with the cooling water from outside of the vacuum vessel 3, as shown by arrow A in FIG. 2.

In implanting ions by generating the plasma, the temperature of the article 2 is increased as the ion implantation proceeds. However, if the article 2 is formed of a material that is not compatible with processing at elevated temperatures, such as a plastic material, it is problematic to raise the temperature of the article 2 excessively at the time of ion implantation.

Thus, with the present surface processing device 1, the article 2 can be cooled by the holder 5 provided with the water-cooling function. By so doing, the surface processing device 1 is able to prohibit the temperature of the article 2 from being elevated excessively to assure stable reliable ion implantation.

The ion generator 6 is plasma generating means for supplying the ion-containing plasma to the inside of the vacuum vessel 3. The ion generator 6 is provided with an ion source 10 for generating ions to be implanted in the article 2 and with a mass separator 11 for guiding only ions implanted in the article 2 from among the particles generated from the ion source 10.

As the ion source 10, a Kaufmann type ion source, a magnetron sputtering ion source or a cathodic arc ion source, may be used. With the Kaufmann type ion source and a magnetron sputtering ion source, ions are generated from an active gas introduced as an ion source. On the other hand, with the cathodic arc ion source, no active gas is used to generate ions. Specifically, with the cathodic arc ion source, arc discharge is produced using a cathode formed of a material which can prove an ion source and, by this arc discharge, the cathode is evaporated to retrieve ionized particles. Since no active gas is used in the cathodic arc ion source for generating ions, it is possible to generate ions as a high vacuum state is maintained.

Meanwhile, if the cathodic arc ion source is used as the ion source 10, there may be raised a problem of generation of liquid droplets due to cathodic fusion. For evading the problem of generation of liquid droplets, an electromagnetic filter is sometimes used to remove the liquid droplets. Such cathodic arc ion source is termed a filtered cathodic arc ion source. It is possible with the surface processing device 1 to use such filtered cathodic arc ion source as the ion source 10.

From the ion source 10, neutral particles and macro-particles with a large mass weight are simultaneously produced. It is however not desirable for particles other than desired ions to reach the article 2 being processed. Thus, the present ion generator 6 is configured to guide only desired ions, from among the particles from the ion source 10, into the inside of the vacuum vessel 3 by the mass separator 11.

This mass separator 11 has a path bent at e.g., 45° and a magnet arranged along the path. Under the magnetic field generated by the magnet, only the desired ions are guided along the bent path into the inside of the vacuum vessel 3. On the other hand, the neutral particles and the macro-particles of a large mass weight are not liable to be constrained by the magnetic field and are intercepted without being able to traverse the bent path.

By arranging the mass separator 11 in this manner between the ion source 10 and the vacuum vessel 3, it becomes possible to intercept neutral particles or macroparticles of large mass weight to guide only the desired ions into the inside of the vacuum vessel 3. This eliminates the effect of the neutral particles or macro-particles of large mass weight to improve the quality of surface processing.

The shutter 7 is arranged in the vicinity of an ion outgoing side of the ion generator 6 to switch between ion supply on and off states to the article 2 being processed. That is, when the shutter 7 is opened, the ions are supplied from the ion generator 11 and, when the shutter 7 is closed, the ion supply from the ion generator 6 is halted.

A pulse power source 8 is electrically connected to the holder 5 in the vacuum vessel 3 to apply a puled voltage to the article 2 through the holder 5. The pulse power source 8 may be configured using a variety of routinely used circuit structures. In the following, a typical structure of the pulse power source 8 is explained.

Referring for example to FIG. 2, this pulse power source 8 includes a first power source 21, as a positive power source, a second power source 22, as a negative power source, a first inverter circuit 23, for converting the DC voltage from the first power source 21 into a pulsed voltage, a second inverter circuit 24, for converting the DC voltage from the second power source 22 into a pulsed voltage, a pulse transformer 25 for raising the pulse voltage from the first and second inverter circuits 23, 24, a control circuit 26 for controlling the first and second inverter circuits 23, 24 and a computer 27 for controlling the operation of the control circuit 26.

In the present pulse power source 8, the first inverter circuit 23 converts the positive DC voltage from the first power source 21 into a pulsed voltage, while converting the negative DC voltage from the second power source 22 into a pulsed voltage.

The outputs from the inverter circuits 23, 24 are controlled by the control circuit 26. Specifically, with the present pulse power source 8, the first inverter circuit 23, outputting the positive pulse voltage, and the second inverter circuit 24, outputting the negative pulse voltage, are operated in parallel to each other, with the positive and negative voltages outputted from the inverter circuits 23, 24 being independently variable as to the pulse peak values, pulse rise time, pulse interval and the pulse widths.

Specifically, the control circuit 26 switches between the output of the first inverter circuit 23 and the output of the second inverter circuit 24, while adjusting the outputs, so that the positive pulse voltage from the first inverter circuit 23 and the negative pulse voltage from the second inverter circuit 24 will be outputted alternately. The pulsed voltage, thus controlled by the control circuit 26, and outputted by the inverter circuits 23, 24, are routed to a primary winding of the pulse transformer 25.

The pulsed voltage, supplied to the pulse transformer 25, is boosted by the pulse transformer 25, the secondary winding of which has its one terminal grounded and its other terminal passed through the inside of the supporting member 9 carrying the holder 5 so as to be secured to a stationary surface of the holder 5. Therefore, if the article 2 is secured to the holder 5, the pulsed voltage, boosted by the pulse transformer 25, is applied to the article 2.

With the pulse power source 8, the pulse peak value, pulse rise time, pulse interval and the pulse width of the pulsed voltage, applied to the article 2, or the sequence of the positive and negative pulses, can be freely controlled subject to issuing corresponding input commands to the computer 27. That is, when employing the pulse power source 8, a command as to which waveform of the pulsed voltage is to be supplied to the article 2 is inputted to the computer 27. Based on this input command, the computer 27 outputs a command to the control circuit 26 so that the pulsed voltage of the desired waveform will be applied to the article 2. Based on the command to the computer 27, the control circuit 26 controls the outputs of the first and second inverter circuits 23, 24.

Specifically, the pulse power source 8 is able to independently control the positive and negative pulse peak values applied to the article 2 from approximately 1 kV to approximately 100 kV, while it is able to control the pulse width in a range from approximately 1 $\mu$s to approximately 50 $\mu$s. The sequence in which the positive and negative pulsed voltages are outputted can also be controlled by the computer 27 connected to the control circuit 26.

Thus, the surface processing device 1 is configured to freely control the waveform of the pulsed voltage applied to the article 2 by the control circuit 26 switching between positive and negative pulsed voltages and performing output adjustment.

In the present pulse power source 8, the inverter circuits 23, 24 are desirably constructed by semiconductor circuits. Since the inverter circuits constructed by the semiconductor circuits are inexpensive, the inverter circuits 23, 24 built into the pulse power source 16 can be constructed inexpensively. Also, the pulse power source 8 can be miniaturized since the circuit constructed by semiconductor circuits lends itself to size reduction.

Meanwhile, if the circuits constructed by semiconductor circuits as used as the inverter circuits 23, 24, are used, it becomes difficult to produce a high output voltage from the inverter circuits 23, 24. In such case, it is sufficient if the output from the inverter circuits 23, 24 is boosted by the pulse transformer 25.

It is also possible to use vacuum tube circuits for the inverter circuits 23, 24. With the inverter circuit, employing the vacuum tube, a high output voltage can be realized. Thus, if the vacuum tube circuits are used as the inverter circuits 23, 24, it is possible to apply the pulsed voltage outputted by the inverter circuits 23, 24 directly to the article 2 without the intermediary of the pulse transformer 25.

If the article 2 is surface-processed by the inventive technique, using the above-described surface processing device 1, an electrically conductive thin metal film is first formed on the surface of the article 2 as an insulating material.

In this film forming process, a thin metal film is formed to a thickness of the order of 100 nm by a variety of the CVD (chemical vapor deposition) on the surface of the article 2. The material used in forming the thin metal film may, for example, be titanium, titanium nitride or copper. If the thin metal film is to be formed of titanium, titanium chloride ($TiCL_4$), for example, may be used as a precursor. If the thin metal film is to be formed from titanium nitride, tetrakis (dimethylamino) titanium (TDMAT) or tetrakis (diethylamino) titanium (TDEAT), for example, is used a sa precursor. If the thin metal film formed of copper is to be formed, copper hexafluoroacetylacetonate trimethylvinylsilane (Cu(hfac) TMVS, for example, may be used.

The article 2, on the surface of which the thin metal film has now been deposited, is secured to the holder 5 provided in the interior of the vacuum vessel 3. The interior of the vacuum vessel 3 then is evacuated by the cryo pump 4 to set up a high vacuum state. The pressure in the vacuum vessel 3, that is the background pressure, is set to, for example, approximately $10^{-7}$ Torr.

If the article 2 is formed of a material incompatible with processing at elevated temperatures, such as plastics, the cooling water is fed to a cooling water inlet pipe built into the holder 5 to prohibit the temperature of the article 2 from being elevated excessively.

Then, by the ion generator 6, ions to be implanted into the article 2 is generated and sent to the inside of the vacuum vessel 3 in the plasma beam state. The pressure in the vacuum vessel 3, that is the pressure during the surface processing, is of the order of e.g., $10^{-5}$ Torr.

With the article 2 arranged in a plasma containing ions to be implanted, the pulsed voltage generated by the pulse power source 8 is applied to the article 2. This pulls the ions into the article 2 to execute ion implantation into the article 2.

More specifically, when the negative pulse voltage is applied to the article 2, positive ions contained in the plasma are pulled into the article 2 to effect ion implantation. At this time, the amount of ion implanted in the article 2, depth of ion implantation and the implantation profile depend on the pulse peak value, pulse rise time, pulse interval or the pulse depth of the negative pulse voltage applied to the article 2. Thus, by controlling the waveform of the pulsed voltage applied to the article 2, it is possible to control the amount and the depth from the surface of the article 2 as well as the implantation profile, that is the relationship between the depth from the surface of the article 2 and the concentration of ions implanted in the article 2.

Meanwhile, if ions are pulled into the article 2 to effect ion implantation, electrical charges are accumulated in the article 2 to set up the so-called charged-up state. The result is that, if the negative voltage is continuously applied to the article 2, it becomes impossible to continue ion implantation into the article 2 efficiently. Thus, in the present technique, the bias voltage applied to the article 2 is the pulsed voltage containing the positive pulsed voltage and the negative pulsed voltage to neutralize the charges accumulated in the article 2 with the positive pulsed voltage.

In more detail, if the positive pulsed voltage is applied to the article 2, electrons are pulled into the article 2 to neutralize the electrical charges accumulated n the article 2. Thus, if the charges accumulated in the article 2 is neutralized, the ions can be efficiently pulled into the article 2 when the negative pulsed voltage is subsequently applied to enable efficient ion implantation into the article 2.

If the bias voltage applied to the article 2 is the pulsed voltage containing both the positive and negative pulsed voltages, as described above, it is possible to effect continuous ion implantation into the article 2 efficiently without producing the charged-up state of the article 2 as the insulating material. This is effective to shorten the process time and to improve the productivity when surface-processing the article 2.

It is also desirable that the pulsed voltage be not applied to the article 2 for a time period (non-voltage-applying time period). With the surface processing device 1, used in the present technique, there is no possibility of ions being pulled and implanted when no bias voltage is applied to the article 2, with the ions being accumulated on the article 2. That is, the ions are illuminated by the ion generator 6 to the article 2 in the state of a plasma beam so that the ions are accumulated on the article 2 to deposit a thin film formed by the elements of the ions.

Thus, by applying the pulsed voltage including the non-voltage-applying time period to the article 2, there are simultaneously formed a surface-modified layer containing implanted ions and a thin film layer formed by the elements of the ions little by little on the article 2.

With the technique of the present invention, as described above, an electrically conductive thin metal film first is formed on the surface of the article 2 being processed and subsequently ion implantation is performed. This enables the ions to be implanted uniformly on the surface of the article 2. This point will be explained hereinafter by referring to FIG. 3.

Figure 3:
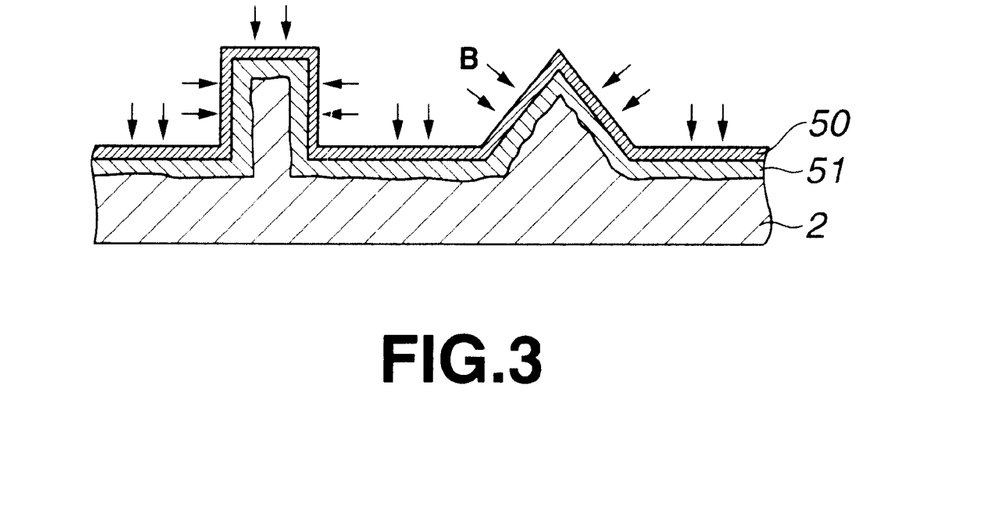
FIG. 3 is a schematic cross-sectional view for illustrating a surface-modified layer formed on the surface of the insulating material by the surface processing method of FIG. 2.

That is, if the pulsed voltage is applied to the article 2, having the thin metal film 50 formed on its surface, a plasma sheath is produced in a direction perpendicular to the article surface, as indicated by arrow B in FIG. 3. This implants ions in the plasma in a direction perpendicular to the article surface. At this time, the implanted ions traverse the thin metal film 50 so as to be implanted into the article 2, so that a surface-modified layer 51 of a uniform thickness is formed on the article surface to follow its surface profile.

If conversely the ion implantation is performed without forming the thin metal film 50, ion implantation occurs on the whole on minute crests formed on the article surface, such that ions cannot be implanted to a uniform thickness on the article 2 having a three-dimensional surface profile.

Therefore, with the present technique, a surface-modified layer, containing implanted ions therein, can be formed to a uniform thickness to high quality on the article surface even if the article 2 has a three-dimensional surface profile.

Also, in the present technique, since the bias voltage applied to the article 2 is the pulsed voltage containing both the positive and negative pulsed voltages, no charged-up state is set even if the article 2 is an insulating material, so that ion implantation can be executed on the article 2 continuously and efficiently. Thus, the time necessary for surface processing the article 2 can be shortened to improve the productivity.

Figure 4:
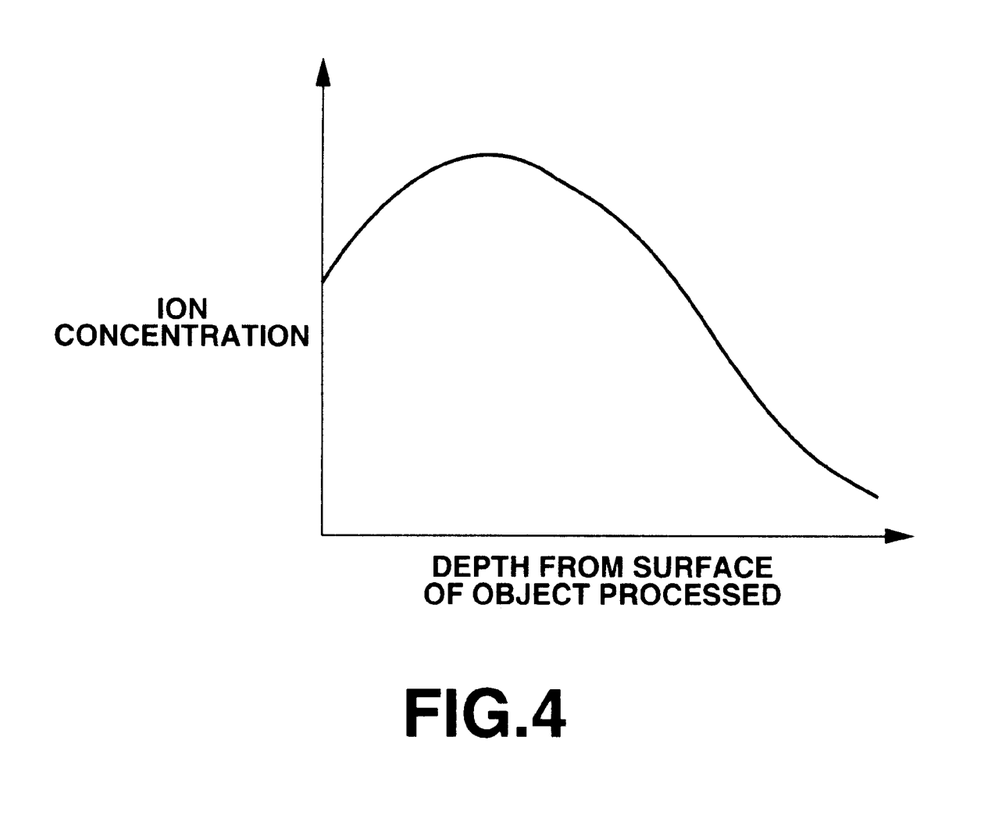
FIG. 4 illustrates the relationship between the depth of ions implanted into the article being processed from the article surface and the ion concentration.

Meanwhile, if ion implantation is effected by plasma implantation method as in the present technique, an ion beam having a certain energy is accelerated and implanted into the article 2, so that the implantation profile is a Gaussian distribution having a peak in the vicinity of the article surface.

Figure 5:
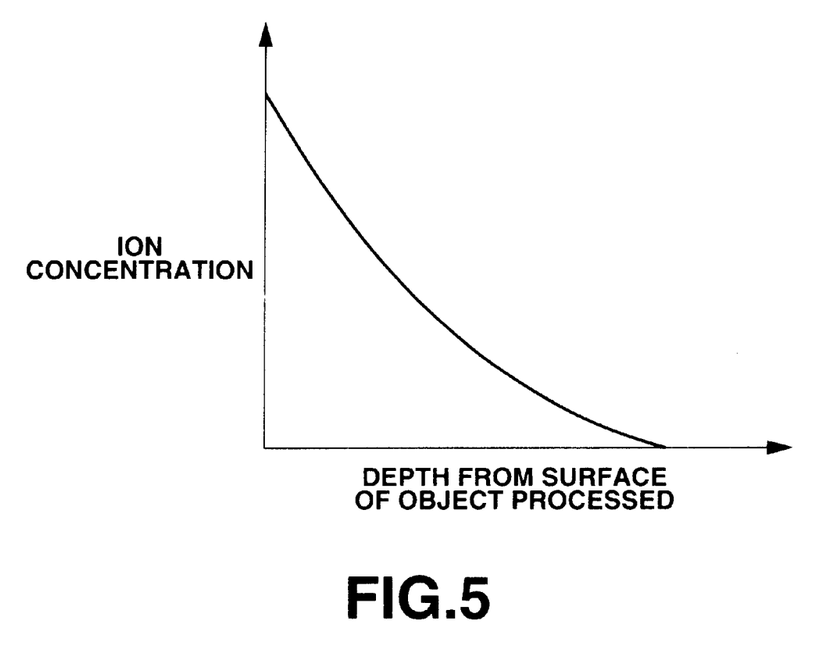
FIG. 5 illustrates the relationship between the depth of ions implanted into the article being processed from the surface of an insulating material and the ion concentration.

If conversely the ion implantation is effected by the plasma implantation method as in the present technique, it is possible to control the amount or depth of ion implantation or the ion implantation profile by controlling the waveform of the pulsed voltage applied to the article 2. Thus, the im profile may be so designed as to have a peak in the vicinity of the article surface, as shown for example in FIG. 5.

Meanwhile, the article 2 to be surface-processed as described above may be enumerated by, for example, a rotary drum used for recording and/or reproduction of a magnetic tape by the helical scan system, a printer head used in a printer adapted to effect printing by ejecting ink droplets onto a printing support, a substrate for supporting the recording layer of a recording medium, a recording medium having a recording layer formed on the substrate, a recording medium having a recording layer on a substrate and having a protective film formed on the recording layer, a panel substrate for sealing in a liquid crystal in a liquid crystal panel, a printed matter having printing made on an insulating material, and a variety of micro-machines fabricated from insulating materials, such as plastics.

Figure 6:
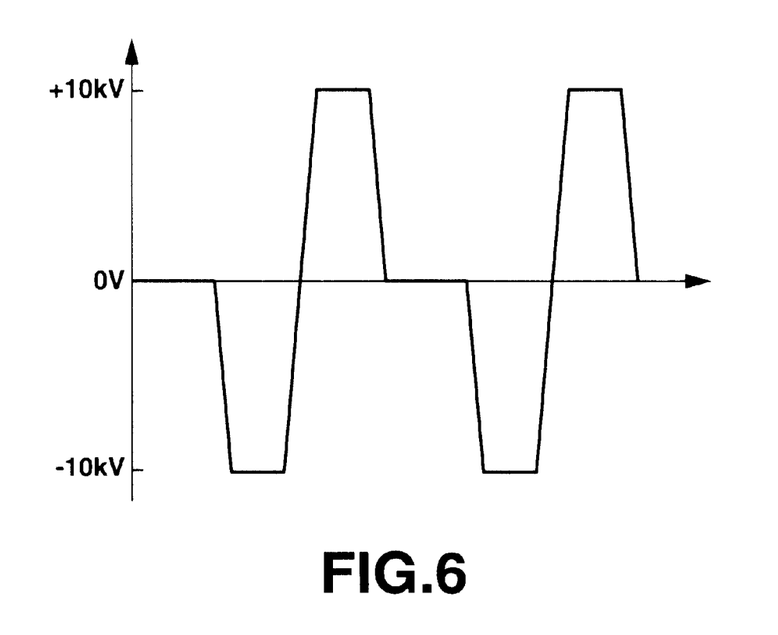
FIG. 6 illustrates a typical waveform of a pulsed voltage applied to the insulating material.
Figure 7:
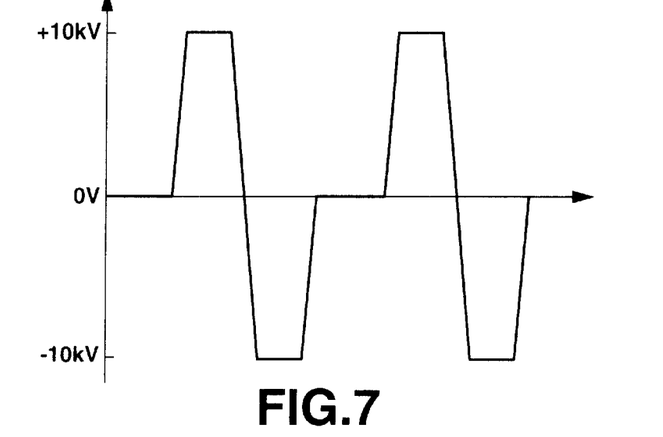
FIG. 7 illustrates another typical waveform of a pulsed voltage applied to the insulating material.

Referring to FIGS. 6 and 7, the waveform of the pulsed voltage applied to the article 2 when implanting ions into the article 2 is explained. Meanwhile, the waveform of the pulsed voltage applied to the article 2 is not limited to one now explained since it suffices if the pulse peak values, pulse rise time etc are controlled and the positive and negative pulsed voltages are suitably combined and adjusted to realize the desired processing.

The waveform of the pulsed voltage applied to the article 2 is such a one comprising a negative pulsed voltage followed by a positive pulsed voltage of substantially the same absolute value of the pulse peak and a non-voltage-applying time period, as shown in FIG. 6. A series of pulse trains of this waveform are repeatedly applied to the article 2.

If the pulsed voltage is of a waveform shown in FIG. 6, the ions are pulled into the article 2 on application of the negative pulsed voltage to effect ion implantation. As the ions are pulled into the article 2, electrical charges are accumulated in the article 2. If a positive pulsed voltage is applied to the article 2, the electrical charges accumulated in the article 2 are neutralized.

Thus, by applying the pulsed voltage of the waveform such as is shown in FIG. 6 to the article 2 as a bias voltage, there is no possibility of the article 2 formed of an insulating material being in a charged-up state, thus enabling continuous ion implantation.

In the embodiment shown in FIG. 7, the sequence of the positive and negative polarities are reversed from that used in FIG. 6. That is, in the embodiment shown in FIG. 7, a negative pulsed voltage is first applied, a positive pulsed voltage having substantially the same absolute value of the pulse peak is immediately applied followed by a non-voltage-applying time period. Such a sequence of pulses are repeatedly printed on the article 2.

If the pulsed voltage is of a waveform shown in FIG. 7, the ions are pulled into the article 2 on application of the negative pulsed voltage to effect ion implantation. As the ions are pulled into the article 2, electrical charges are accumulated in the article 2. If a positive pulsed voltage is applied to the article 2, the electrical charges accumulated in the article 2 are neutralized.

Thus, by applying the pulsed voltage of the waveform such as is shown in FIG. 7 to the article 2 as a bias voltage, there is no possibility of the article 2 formed of an insulating material being in a charged-up state, thus enabling continuous ion implantation.

In the embodiments shown in FIGS. 6 and 7, there is provided a timer period in which no voltage is supplied between two neighboring pulses. The ions reaching the article 2 with the initial energy during the non-voltage-applying time period are directly accumulated on the article 2. Thus, it is not the ion implantation in the article 2 but the film forming on the article 2 that occurs during the non-voltage-applying time period. That is, in the embodiments shown in FIGS. 6 and 7, both the effects of ion implantation and film formation are achieved in combination.

On the other hand, if it is not desired to deposit a film on the article 2, it suffices if DC voltage components are superposed on the pulsed voltage applied to the article 2. By so doing, only ion implantation on the article 2 takes place, without there being set a film-depositing state between neighboring pulses.

In the foregoing description, it is presupposed that ions are implanted on application of a negative voltage to the article 2 being processed. However, depending on conditions, no ions are intruded into the inside of the article 2 on application of a negative voltage to the article 2, but a sputtering state may be set. Thus, in the present technique, it is possible to control the waveform of the pulsed voltage applied to the article 2 to effect ion implantation and to perform sputtering positively.

On the other hand, it is also possible in the above-described surface processing device 1 that the ion generator 6 can be operated with pulses, or that ions can be intermittently supplied into the inside of the vacuum vessel 3 by controlling the opening/closing operation of the shutter 7. To this end, the ions to be implanted into the article 2 for ion implantation may be supplied in synchronism with the pulses of the bias voltage applied to the article 2 being processed. If the ions can be intermittently supplied in this manner, surface processing for the article 2 can be controlled more finely under desired conditions.

A printer head according to the present invention is hereinafter explained. As an illustrative structure of the printer head according to the present invention, a printer head 60, shown in FIG. 8, is explained.

The printer head 60 is provided on a printer configured to eject ink droplets onto a printing support, such as a paper sheet, to effect printing. A plurality of such printer heads 60 are provided in adjacency to one another with respect to the printer. The printer heads 60 eject ink droplets independently onto the printing support to print a sole image thereon.

Figure 8:
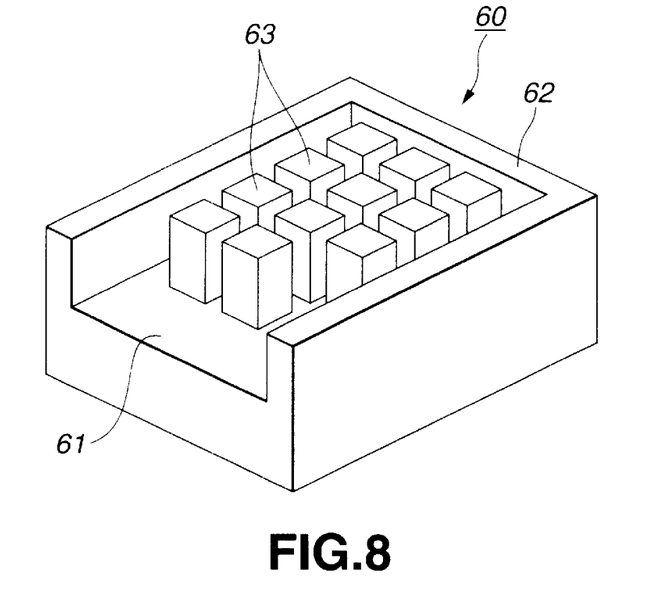
FIG. 8 is a schematic perspective view showing an illustrative structure of a printer head according to the present invention.

The printer head 60 has a liquid droplet ejecting unit 61, as shown in FIG. 8. The liquid droplet ejecting unit 61 is a recessed space surrounded by a barrier wall section 62 having a height of the order of several to tens of microns ($\mu$m). Within the recessed space, there are set plural tetragonally-shaped columns 63. In a bottom portion of the liquid droplet ejecting unit 61 are assembled heating elements, not shown. The barrier wall section 62 has the function of a barrier wall section for prohibiting the ink supplied to the liquid droplet ejecting unit 61 from being mixed with the ink of the neighboring printer heads 60.

For incorporating the printer heads 60 in the printer to effect printing, the printer heads 60 are arranged so that the printing support faces the liquid droplet ejecting unit 61. The ink is supplied to the liquid droplet ejecting unit 61 and simultaneously heated by the heating element. This ejects the ink supplied to the liquid droplet ejecting unit 61 as ink liquid droplets. These ink liquid droplets then reach the printing support to effect printing.

On the liquid droplet ejecting unit 61 of the printer head 60 is formed a surface-modified layer modified by ion implantation. Specifically, oil repellence of the barrier wall section 62 has been improved by the provision of the surface-modified layer on the surface of the barrier wall section 62. On the other hand, a surface-modified layer different from that provided on the barrier wall section 62 is formed on the surface of the tetragonally-shaped column 63 to improve the hardness of the tetragonally-shaped column 63.

Since the oil-repellence of the barrier wall section 62 of the printer head 60 is improved as described above, the ink supplied to the neighboring printer heads 60 may be prohibited from becoming mixed with each other through the barrier wall sections 62. Moreover, since the tetragonally-shaped column 63 of the printer head 60 is improved in hardness, the printer head 60 may be improved in durability and operational reliability.

On the other hand, in the printer head 60, in which the barrier wall section 62 and the tetragonally-shaped column 63 are improved in characteristics by the provision of the surface-modified layer of the liquid droplet ejecting unit 61, the ink flow is improved to prevent the ink from being scorched to the printer head 60.

Thus, the printer head 60, in which the surface-modified layer has been formed on the liquid droplet ejecting unit 61, is improved in operational reliability, such that a high printing quality may be maintained even after prolonged use.

The method for fabricating the above-described printer head 60 is hereinafter explained.

For fabricating the printer head 60, an insulating film of e.g., silicon oxide, is formed by any of a variety of thin film forming techniques on a silicon substrate having a pre-set thickness. A thin polysilicon film is then formed to a thickness of several microns ($\mu$m) on the substrate now carrying the insulating film. A first photoresist then is formed on the thin polysilicon film and processed with anisotropic dry etching employing a chlorine gas or a fluoride gas to selectively etch the thin polysilicon film. Wet etching may also be performed using e.g., an aqueous solution of alkali hydroxides. By etching the thin polysilicon film in this manner, a polysilicon heater having a width of e.g., 20 $\mu$m is formed. This polysilicon heater proves the above-mentioned heating element.

The first photoresist is then removed and a heat insulating layer then is formed on the substrate now carrying the polysilicon heater. This heat insulating layer is formed of, for example, silicon oxide or polyimide. A second first photoresist is then formed on the heat insulating layer and patterned by a lithographic technique. Plural tetragonally-shaped column 63 are formed by anisotropic dry etching or dry etching as described above.

The second photoresist then is removed to form a first thin metal film on the surface of the tetragonally-shaped column 63. At this time, the first thin metal film is formed from such materials as titanium, titanium nitride or copper, by a variety of CVD methods, in the same way as in forming the thin metal film on the surface of the article 2.

In the substrate, on the surfaces of the tetragonally-shaped column 63 of which the first thin metal films have been formed as described above, ion implantation is carried out, using the surface processing device 1, in the same way as in the above-mentioned article 2. Specifically, a plasma containing carbon ions is supplied to the inside of the vacuum vessel 3 by a Kaufmann type ion source having paraffinic hydrocarbons, such as gaseous methane, as an ion source. It is also possible to supply a plasma containing carbon ions by a cathodic arc ion source having solid carbon as an ion source. The pressure in the vacuum vessel 3, that is the pressure used during the surface processing, is of the order of $10^{-2}$ Pa to $10^{-6}$ Pa.

As the carbon ion containing plasma encircles the substrate, the pulsed voltage is applied to the substrate as in the case of the article 2 described above. The pulsed voltage applied at this time is of such a waveform that the pulse width is 5 $\mu$s and the pulsed voltage peak value is $\pm 10$ kV. The surface processing time duration is e.g., 1 to 20 minutes.

In this manner, the tetragonally-shaped column 63 are provided with surface-modified layers and thereby improved in hardness.

The first thin metal film then is removed by wet etching. At this time, the hydrogen fluoride, a mixed solution of aqueous hydrogen peroxide and ammonium hydroxide or nitric acid is used if the first thin metal film is of titanium, titanium nitride or copper, respectively.

On the substrate, freed of the first thin metal film, a second photoresist is formed, and patterning then is carried out so that only the surface of the barrier wall section 62 is exposed by the lithographic technique. The barrier wall section 62 may be formed of silicon oxide or chromium. On the surface of the barrier wall section 62, exposed by the second photoresist, a second thin metal film is formed, as in the case of the first thin metal film, and ion implantation is executed using the surface processing device 1.

The barrier wall section 62 is surface-processed using ion species implanted or surface processing conditions different from those used for the surface processing of the above-mentioned tetragonally-shaped columns 63. By so doing, there is formed on the surface of the barrier wall section 62 a surface-modified layer different in characteristics from that formed on the tetragonally-shaped column 63, that is a surface-modified layer exhibiting oil repellence.

The second thin metal film then is removed, as the first thin metal film, to complete the printer head 60.

By fabricating the printer head 60 as described above, it is possible to effect surface processing for the surface of the tetragonally-shaped column 63 different from that for the barrier wall section 62 to form a surface-modified layer having different physical characteristics. It is therefore possible to provide the printer head 60 in which the barrier wall section 62 exhibits oil repellence and the tetragonally-shaped column 63 is improved in hardness.

Thus, the printer head 60 may be improved in operational reliability by the surface-modified layer provided on the liquid droplet ejecting unit 61. On the other hand, high printing quality may be maintained even on prolonged application.

Moreover, by fabricating the printer head 60 using the technique according to the present invention, the surface-modified layer can be formed uniformly along the surface profile even if the printer head 60 has a complex three-dimensional shape such as that of the barrier wall section 62 or the tetragonally-shaped column 63. Thus, the printer head 60 may be fabricated reliably to high quality.

In the foregoing description, the thin metal film formed at the time of the ion implantation is removed. Alternatively, the printer head 60 may be fabricated without removing the thin metal film. In this case, the printer head 60 is completed while as yet the thin metal film is left on the surface of the barrier wall section 62 or the tetragonally-shaped column

63. If a thin metal film is further formed on the surface-modified layer, it is possible to improve toughness and hardness of the tetragonally-shaped column 63. In the printer head 60, whether the thin metal film is to be removed or left may be determined in consideration of desired printing characteristics and required physical properties.

An experiment for measuring the oil contact angle for ascertaining oil repellence in the printer head 60 surface processing as described above is hereinafter explained.

Experiment for Measuring Contact Angle

An evaluation substrate formed of silicone oxide was provided and the wetting phenomenon between the evaluation substrate and the oil was measured using an AA-D type contact angle meter manufactured by KYOWA KAIMEN KAGAKU SHA in order to check oil repellence in the printer head 60 surface-processed as described above. A thin metal film was formed on the surface of the evaluation substrate, in the same way as in surface processing the printer head 60, and ion implantation was performed to process the surface of the printer head 60. Measurements were then made of the wetting phenomenon between the oil and the surface-processed evaluation substrate.

As a result, it was found that the contact angle, which was 40° before surface processing, was 140° after the surface processing. Thus, it was confirmed that oil repellence has been improved by surface processing the evaluation substrate formed of silicon oxide.

Figure 9:
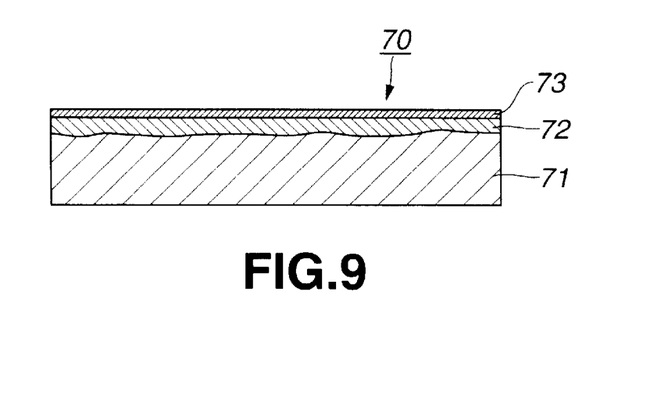
FIG. 9 is a schematic perspective view showing an illustrative structure of a substrate for a recording medium according to the present invention.

A substrate for a recording medium according to the present invention is hereinafter explained. In the following, a disc substrate 70 shown in FIG. 9 is explained as an illustrative structure of a substrate for a recording medium according to the present invention.

The disc substrate 70 is a substrate for supporting a signal recording layer of the recording medium, such as a magnetic disc, a replay-only optical disc, a magneto-optical disc or a phase-change optical disc. The disc substrate 70 is comprised of a main body portion of the substrate 71, an ion-implanted surface-modified layer 72 formed on the main body portion of the substrate 71 and a thin metal film 73 formed thereon.

If the disc substrate 70 is used as a substrate for a recording medium, there are formed on the thin metal film 73 respective layers, such as a signal recording layer for recording and/or reproducing information signals, and a light-transmitting protective layer for protecting the signal recording layer. In the recording medium, thus formed, laser light is illuminated by a recording and/or reproducing apparatus to the signal recording layer to record and/or reproduce the information signals on or from the signal recording layer.

In the disc substrate 70, the main body portion of the substrate 71 is formed in a planar shape from plastics, such as amorphous polyolefin (APO), polycarbonate (PC), polymethyl methacrylate (PMMA), polyethylene terephthalate (PET), acrylic resin or polyimide resin, or a glass material.

The surface-modified layer 72 is formed by ion implantation in the surface of the main body portion of the substrate 71, as in the surface processing method for the article 2 described above. The disc substrate 70 is improved in hardness and toughness by the surface-modified layer 72 provided thereon. The recording medium may be reduced in flexure and in severe deviation form planarity due to resonant vibrations on high-speed rotation at the time of recording and/or reproduction. By using the disc substrate 70 as a substrate for the recording medium, a recording medium may be provided which is able to perform recording and/or reproduction in stability.

The disc substrate 70 is also provided with the thin metal film 73 which is formed in forming the surface-modified layer 72 in the surface processing method for the article 2 described above. This thin metal film 73 has the function as a light reflecting layer for reflecting the laser light used for recording and/or reproduction. The thin metal film 73 also has the function of a heat dissipating layer for suppressing temperature rise of the signal recording layer otherwise caused due to irradiation of the laser light.

In the disc substrate 70, the thin metal film 73 formed for forming the surface-modified layer 72 may directly be used as a light reflecting layer or a heat dissipating layer of the recording medium, so that the step of removing the thin metal film 73 or the step of newly forming a light reflective layer or a heat dissipating layer may be eliminated.

If, in the disc substrate 70, there is no necessity of providing a light reflective layer or a heat dissipating layer in the layered structure of the ultimate recording medium, it is also possible to eliminate the thin metal film 73 after forming the surface-modified layer 72 and to deposit the respective layers on the surface-modified layer 72.

What is claimed is:

1. A printer head provided on a printer adapted to perform printing by ejecting ink liquid droplets towards a printing support wherein a surface-modified layer modified in surface properties by ion implantation is formed on the surface of a liquid droplet ejecting portion adapted to eject said ink liquid droplets.

2. The printer head according to claim 1 wherein an electrically conductive thin metal film is formed on said surface-modified layer in said liquid droplet ejecting portion.

* * * * *